US011076407B2

(12) United States Patent
Guo

(10) Patent No.: US 11,076,407 B2
(45) Date of Patent: Jul. 27, 2021

(54) METHODS AND APPARATUS FOR DETECTING ACK/NACK BITS WITH DUAL LIST-RM DECODER AND SYMBOL REGENERATION FOR LTE PUCCH FORMAT 3

(71) Applicant: Yuanbin Guo, Mountain House, CA (US)

(72) Inventor: Yuanbin Guo, Mountain House, CA (US)

(73) Assignee: Marvell Asia Pte, Ltd., Singapore (SG)

( * ) Notice: Subject to any disclaimer, the term of this patent is extended or adjusted under 35 U.S.C. 154(b) by 0 days.

(21) Appl. No.: 16/264,328

(22) Filed: Jan. 31, 2019

(65) Prior Publication Data

US 2019/0335468 A1 Oct. 31, 2019

Related U.S. Application Data

(60) Provisional application No. 62/663,570, filed on Apr. 27, 2018.

(51) Int. Cl.
*G01R 31/08* (2020.01)
*H04W 72/04* (2009.01)
*H04L 25/02* (2006.01)
*H04L 5/00* (2006.01)

(52) U.S. Cl.
CPC ....... *H04W 72/0466* (2013.01); *H04L 5/0055* (2013.01); *H04L 25/0202* (2013.01); *H04W 72/0413* (2013.01)

(58) Field of Classification Search
None
See application file for complete search history.

(56) References Cited

U.S. PATENT DOCUMENTS

| 8,929,319 B2* | 1/2015 | Anderson | H04L 5/0037 370/329 |
| 2012/0084618 A1* | 4/2012 | Choudhury | H03M 13/136 714/752 |
| 2012/0177140 A1* | 7/2012 | Sahara | H04B 7/0456 375/267 |
| 2013/0301758 A1* | 11/2013 | Reial | H04L 1/0051 375/340 |

(Continued)

OTHER PUBLICATIONS

"3GPP Technical Specification 36.211", 2013, V10.7.0, Valbonne, France, www.3gpp.org.

(Continued)

*Primary Examiner* — Gerald A Smarth
(74) *Attorney, Agent, or Firm* — JW Law Group; James M. Wu

(57) ABSTRACT

Methods and apparatus for detecting ACK/NACK bits with dual list-RM decoder and symbol regeneration for PUCCH format 3. In an exemplary embodiment, a method is provided for detected ACK/NACK bits received in a long-term evolution (LTE) physical uplink control channel (PUCCH) Format 3 uplink transmission. The method includes generating Top-M ACK candidates from a descrambled bit stream, regenerating Top-M candidate symbols from the Top-M ACK candidates, calculating channel estimates for the Top-M candidate symbols, combining to the channel estimates generate a combined metric; and searching the combined metric to determine detected ACK bits.

15 Claims, 10 Drawing Sheets

(56) References Cited

U.S. PATENT DOCUMENTS

| | | | | |
|---|---|---|---|---|
| 2014/0023011 | A1* | 1/2014 | Gao | H04L 5/0055 370/329 |
| 2015/0110050 | A1* | 4/2015 | Guo | H04L 5/0055 370/329 |
| 2015/0304996 | A1* | 10/2015 | Yang | H04L 5/0055 370/329 |
| 2017/0288848 | A1* | 10/2017 | Lei | H04L 27/2656 |

OTHER PUBLICATIONS

D. Wang, S. Yang, Y. Liao, Y. Liu, "Efficient Receiver Scheme for LTE PUCCH" in IEEE Communications Letter, Mar. 2012, vol. 16 No. 3.

Y. Wu, D. Danev, E. G. Larsson, "On ACK/NACK Messages Detection in the LTE PUCCH with Multiple Receive Antennas" in 20th European Signal Processing Conference, Aug. 27-31, 2012, Bucharest, Romania.

* cited by examiner

METHODS AND APPARATUS FOR DETECTING ACK/NACK BITS WITH DUAL LIST-RM DECODER AND SYMBOL REGENERATION FOR LTE PUCCH FORMAT 3

CLAIM TO PRIORITY

This application claims the benefit of priority from U.S. Provisional Patent Application No. 62/663,570, filed on Apr. 27, 2018, and entitled "METHOD AND APPARATUS FOR DETECTING ACK/NACK BITS FOR CARRIER AGGRESSION WITH DUAL LIST-RM DECODER AND LUT-BASED SYMBOL REGENERATION FOR PUCCH FORMAT 3," which is incorporated by reference herein in its entirety.

FIELD

The exemplary embodiment(s) of the present invention relates to telecommunications network. More specifically, the exemplary embodiment(s) of the present invention relates to receiving and processing data stream via a wireless communication network.

BACKGROUND

With a rapidly growing trend of mobile and remote data access over a high-speed communication network such as 3G or 4G cellular services, accurately delivering and deciphering data streams become increasingly challenging and difficult. The high-speed communication network which is capable of delivering information includes, but not limited to, wireless network, cellular network, wireless personal area network ("WPAN"), wireless local area network ("WLAN"), wireless metropolitan area network ("MAN"), or the like. While WPAN can be Bluetooth or ZigBee, WLAN may be a Wi-Fi network in accordance with IEEE 802.11 WLAN standards.

Typically, wireless network performance depends in part on the quality of the transmission channel. For example, if the channel conditions are good, the network may perform with higher speed and capacity than when the channel conditions are poor. To obtain the best network performance, wireless networks may rely on user devices (e.g., user equipment "UE") to report control information back to the network. The control information includes parameters indicating the channel conditions and/or transmission parameters.

In the Third Generation Partnership Project (3GPP) Long-Term Evolution (LTE) standard, a Physical Uplink Control Channel (PUCCH) carries important control information, such as HARQ-ACK bits or SR bits for carrier aggregation. The performance of ACK messages play an important role in the overall downlink performance as the residual error rate of HARQ is in the same order of the feedback error rate of ACK bits. For example, after a user device receives a transmission from a network server, it generates acknowledgement (ACK) bits that indicates whether or not the transmission was properly received. The ACK bits are transmitted back to the network server through the PUCCH. The server can determine from the received ACK bits whether the transmission was properly received, and initiate a retransmission if necessary.

Therefore, it is desirable to have a mechanism that efficiently recovers received acknowledgement information to enhance network performance.

SUMMARY

The following summary illustrates a simplified version(s) of one or more aspects of present invention. The purpose of this summary is to present some concepts in a simplified description as more detailed descriptions will be presented later. In various exemplary embodiments, methods and apparatus are provided for efficiently detecting ACK/NACK bits received in LTE PUCCH format 3 uplink communications using Reed-Muller decoders and symbol regeneration.

In an exemplary embodiment, a method is provided for detected ACK/NACK bits received in a long-term evolution (LTE) physical uplink control channel (PUCCH) Format 3 uplink transmission. The method includes generating Top-M ACK candidates from a descrambled bit stream, regenerating Top-M candidate symbols from the Top-M ACK candidates, calculating channel estimates for the Top-M candidate symbols, combining to the channel estimates generate a combined metric, and searching the combined metric to determine detected ACK bits.

In an exemplary embodiment, an apparatus is provided for detected ACK/NACK bits received in a long-term evolution (LTE) physical uplink control channel (PUCCH) Format 3 uplink transmission. The apparatus comprises a Top-M Reed Muller (RM) decoder that generates Top-M ACK candidates from a descrambled bit stream, and a symbol regenerator that regenerates Top-M candidate symbols from the Top-M ACK candidates. The apparatus also comprises a channel estimator that calculates channel estimates for the Top-M candidate symbols, a combiner that combines the channel estimates generate a combined metric, and a decision detector that searches the combined metric to determine detected ACK bits.

Additional features and benefits of the exemplary embodiment(s) of the present invention will become apparent from the detailed description, figures and claims set forth below.

BRIEF DESCRIPTION OF THE DRAWINGS

The exemplary aspect(s) of the present invention will be understood more fully from the detailed description given below and from the accompanying drawings of various embodiments of the invention, which, however, should not be taken to limit the invention to the specific embodiments, but are for explanation and understanding only.

DETAILED DESCRIPTION

Figure 1:
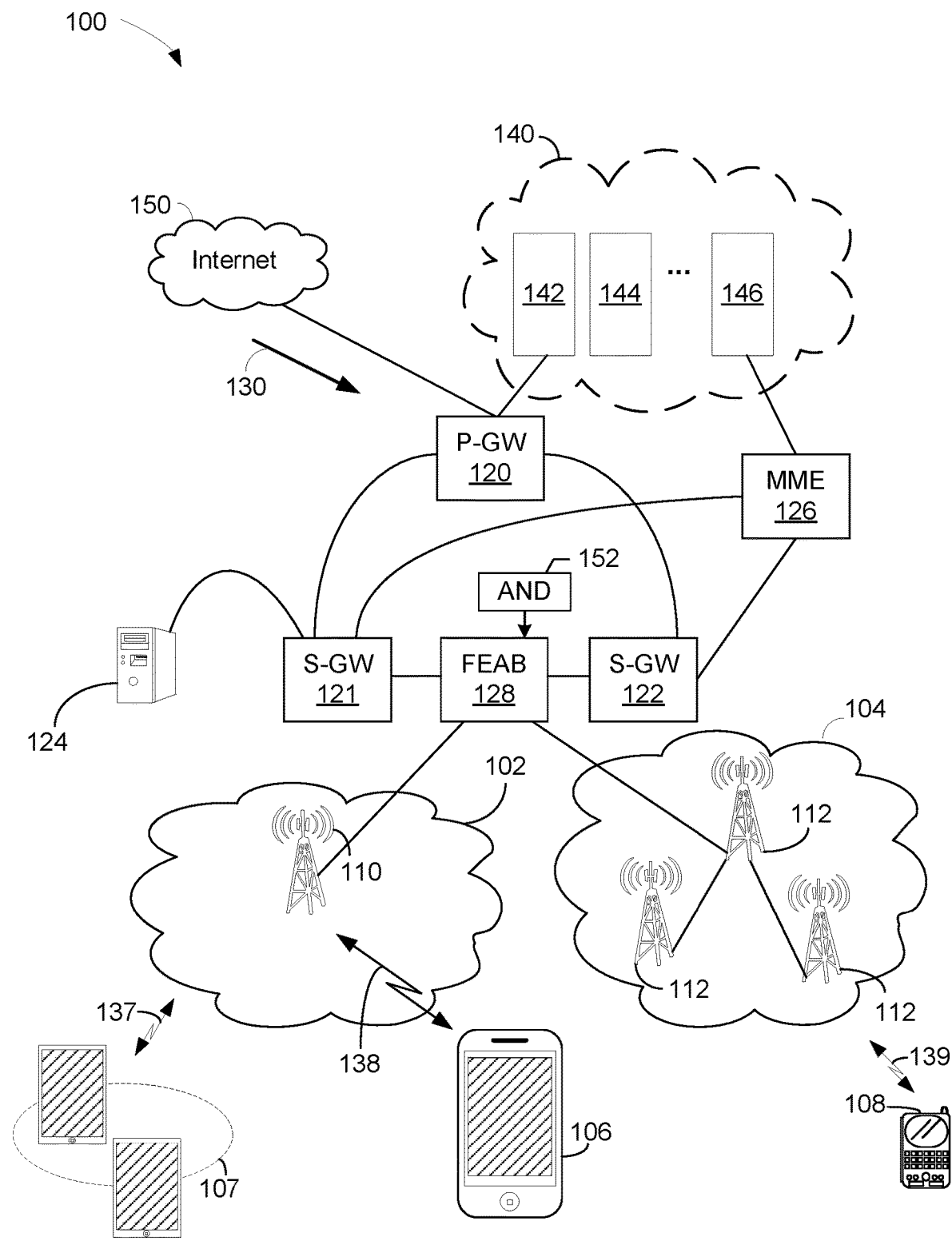
FIG. 1 is a block diagram illustrating a communication network configured to transmit and receive data streams using various embodiments of an ACK/NACK detector to detect ACK/NACK transmissions.

The purpose of the following detailed description is to provide an understanding of one or more embodiments of the present invention. Those of ordinary skills in the art will realize that the following detailed description is illustrative only and is not intended to be in any way limiting. Other embodiments will readily suggest themselves to such skilled persons having the benefit of this disclosure and/or description.

In the interest of clarity, not all of the routine features of the implementations described herein are shown and described. It will, of course, be understood that in the development of any such actual implementation, numerous implementation-specific decisions may be made in order to achieve the developer's specific goals, such as compliance with application- and business-related constraints, and that these specific goals will vary from one implementation to another and from one developer to another. Moreover, it will be understood that such a development effort might be complex and time-consuming but would nevertheless be a routine undertaking of engineering for those of ordinary skills in the art having the benefit of embodiment(s) of this disclosure.

Various embodiments of the present invention illustrated in the drawings may not be drawn to scale. Rather, the dimensions of the various features may be expanded or reduced for clarity. In addition, some of the drawings may be simplified for clarity. Thus, the drawings may not depict all of the components of a given apparatus (e.g., device) or method. The same reference indicators will be used throughout the drawings and the following detailed description to refer to the same or like parts.

The term "system" or "device" is used generically herein to describe any number of components, elements, subsystems, devices, packet switch elements, packet switches, access switches, routers, networks, modems, base stations, eNB (eNodeB), computer and/or communication devices or mechanisms, or combinations of components thereof. The term "computer" includes a processor, memory, and buses capable of executing instruction wherein the computer refers to one or a cluster of computers, personal computers, workstations, mainframes, or combinations of computers thereof.

In this description, IP communication network, IP network, or communication network means any type of network having an access network that is able to transmit data in a form of packets or cells, such as ATM (Asynchronous Transfer Mode) type, on a transport medium, for example, the TCP/IP or UDP/IP type. ATM cells are the result of decomposition (or segmentation) of packets of data, IP type, and those packets (here IP packets) comprise an IP header, a header specific to the transport medium (for example UDP or TCP) and payload data. The IP network may also include a satellite network, a DVB-RCS (Digital Video Broadcasting-Return Channel System) network, providing Internet access via satellite, or an SDMB (Satellite Digital Multimedia Broadcast) network, a terrestrial network, a cable (xDSL) network or a mobile or cellular network (GPRS/EDGE, or UMTS (where applicable of the MBMS (Multimedia Broadcast/Multicast Services) type, or the evolution of the UMTS known as LTE (Long-Term Evolution), or DVB-H (Digital Video Broadcasting-Handhelds)), or a hybrid (satellite and terrestrial) network.

FIG. 1 is a block diagram illustrating a communication network 100 configured to transmit and receive data streams using various embodiments of an ACK/NACK detector (AND) 152 to detect ACK/NACK transmissions. The network 100 includes packet data network gateway ("P-GW") 120, two serving gateways ("S-GWs") 121-122, two base stations (or cell sites) 102-104, server 124, and Internet 150. P-GW 120 includes various components 140 such as billing module 142, subscribing module 144, tracking module 146, and the like to facilitate routing activities between sources and destinations. It should be noted that the underlying concept of the exemplary embodiment(s) of the present invention would not change if one or more blocks (or devices) were added to or removed from diagram 100.

The network configuration illustrated by the communication network 100 may also be referred to as a third generation ("3G"), 4G, LTE, 5G, or combination of 3G and 4G cellular network configuration. MME 126, in one aspect, is coupled to base stations (or cell site) and S-GWs capable of facilitating data transfer between 3G and LTE or between 2G and LTE. MME 126 performs various controlling/managing functions, network securities, and resource allocations.

In an embodiment, the S-GW 121 or 122, in one example, coupled to P-GW 120, MME 126, and base stations 102 or 104, is capable of routing data packets from base station 102, or eNodeB, to P-GW 120 and/or MME 126. A function of S-GW 121 or 122 is to perform an anchoring function for mobility between 3G and 4G equipment. S-GW 122 is also able to perform various network management functions, such as terminating paths, paging idle UEs, storing data, routing information, generating replica, and the like.

In an embodiment, the P-GW 120, coupled to S-GWs 121-122 and Internet 150, is able to provide network communication between user equipment ("UE") and IP based networks such as Internet 150. P-GW 120 is used for connectivity, packet filtering, inspection, data usage, billing, or PCRF (policy and charging rules function) enforcement, et cetera. P-GW 120 also provides an anchoring function for mobility between 3G and 4G (or LTE) packet core network(s).

Sectors or blocks 102-104 are coupled to a base station or FEAB 128, which may also be known as cell site, node B, or eNodeB. Sectors 102-104 include one or more radio towers 110 or 112. Radio tower 110 or 112 is further coupled to various UEs, such as a cellular phone 106, a handheld device 108, tablets and/or iPad® 107 via wireless communications or channels 137-139. Devices 106-108 can be portable devices or mobile devices, such as iPhone®, BlackBerry®, Android®, and so on. Base station 102 facilitates network communication between mobile devices such as UEs 106-107 with S-GW 121 via radio towers 110. It should be noted that base station or cell site can include additional radio towers as well as other land switching circuitry.

Server 124 is coupled to P-GW 120 and base stations 102-104 via S-GW 121 or 122. In one embodiment, server 124 which contains a soft decoding scheme 128 is able to distribute and/or manage soft decoding and/or hard decoding based on predefined user selections. In one exemplary instance, upon detecting a downstream push data 130 addressing to mobile device 106 which is located in a busy traffic area or noisy location, base station 102 can elect to decode the downstream using the soft decoding scheme distributed by server 124. One advantage of using the soft decoding scheme is that it provides more accurate data decoding, whereby overall data integrity may be enhanced.

When receiving bit-streams via one or more wireless or cellular channels, a decoder can optionally receive or decipher bit-streams with hard decision or soft decision. A hard decision is either 1 or 0 which means any analog value greater than 0.5 is a logic value one (1) and any analog value less than 0.5 is a logic value zero (0). Alternatively, a soft decision or soft information can provide a range of value from 0, 0.2, 0.4, 0.5, 0.6, 0.8, 0.9, and the like. For example, soft information of 0.8 would be deciphered as a highly likelihood one (1) whereas soft information of 0.4 would be interpreted as a weak zero (0) and maybe one (1).

A base station, in one aspect, includes one or more FEABs 128. For example, FEAB 128 can be a transceiver of a base station or eNodeB. In one aspect, mobile devices such tables or iPad® 107 uses a first type of RF signals to communicate with radio tower 110 at sector 102 and portable device 108 uses a second type of RF signals to communicate with radio tower 112 at sector 104. After receiving RF samples, FEAB 128 is able to process samples using an ACK/NACK detector (AND) 152 that detects received ACK/NACK bits in LTE PUCCH format 3 uplink transmissions as described in greater detail below.

Table 1 illustrates PUCCH format 3 and specifies two coding scenarios depending on the number of ACK bits, [$N_{A/N}^{PUCCH\ format\ 3} \leq 11$] using a single Reed Muller (RM) coding and [$11 < N_{A/N}^{PUCCH\ format\ 3} \leq 22$] using interleaved dual RM coding.

TABLE 1

Features of PUCCH format 3.

| Format | Channel coding | Modln (Bits) |
|---|---|---|
| Format 3 $N_{A/N}^{PUCCH\ format\ 3} \leq 11$ | Reed Muller | QPSK |
| Format 3 $11 < N_{A/N}^{PUCCH\ format\ 3} \leq 22$ | Interleaved dual Reed Muller | QPSK |

Figure 2:
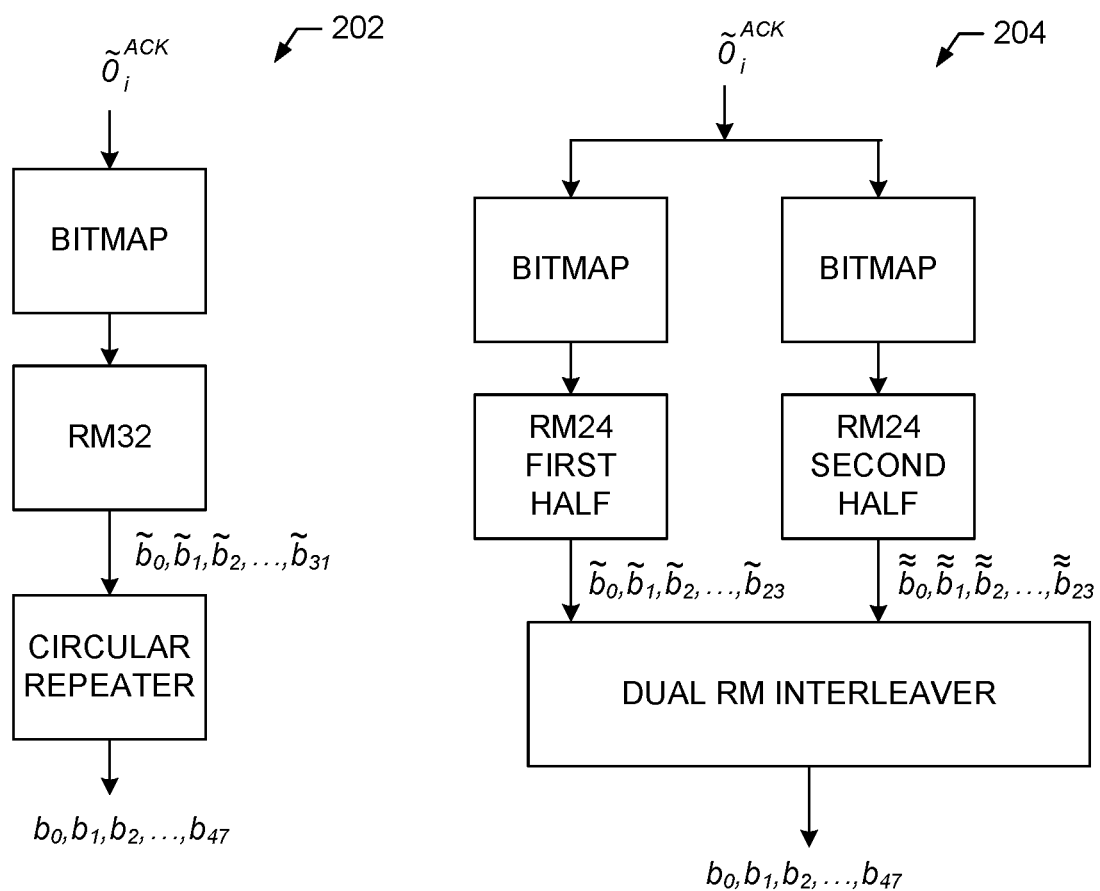
FIG. 2 shows diagrams illustrating channel coding processes.

FIG. 2 shows diagrams illustrating channel coding processes. As illustrated at 202, when $N_{A/N}^{PUCCH\ format\ 3} \leq 11$, the ACK information bits are coded with a single RM32 code and circularly repeated to generate 48-bit encoded bits.

As illustrated at 204, when $11 < N_{A/N}^{PUCCH\ format\ 3} \leq 22$, the ACK information bits are first separated and then encoded with dual RM24 code bits. The results are then interleaved by an interleaver to generate 48-bit interleaved encoded bits.

Figure 3:
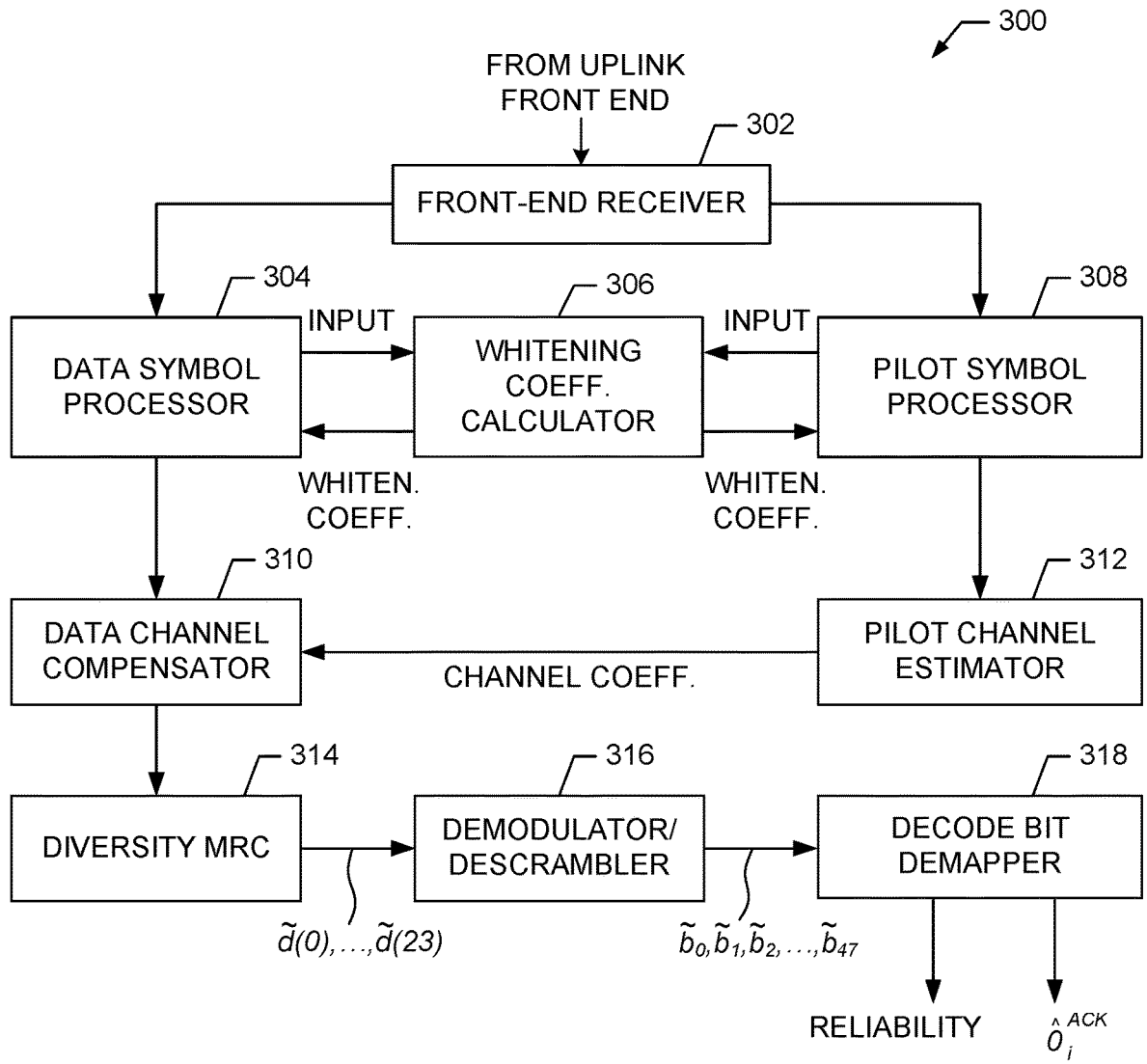
FIG. 3 shows a block diagram of a receiver that comprises Reed Muller (32) or dual Reed Muller (24) decoders to detect ACK/NACK transmission.

FIG. 3 shows a block diagram of a receiver 300 that comprises RM32 or dual RM24 decoders to detect ACK/NACK transmission. A front-end receiver 302 receives uplink transmissions and performs front end fast Fourier transform (FFT) processing to extract data and pilot information. The data information is input to a data symbol processor 304 and the pilot information is input to a pilot symbol processor 308.

A whitening coefficient calculator 306 generates whitening coefficients for both the pilot symbol processor 308 and the data symbol processor 304. The pilot symbol processor 308 performs pilot AFC processing and whitening to generate processed pilot information that is input to a pilot channel estimator 312. The pilot channel estimator 312 generates channel estimates that are input to a data channel compensator 310. The data symbol generator 304 performs DFT, dispreading, and channel whitening to generate processed data symbols that also are input to the data channel compensator 310.

The data channel compensator 310 outputs compensated data to a diversity MRC block, which outputs scrambled data (e.g., $\tilde{d}(0), \ldots, \tilde{d}(23)$) to a demodulator/descrambler 316 that generates demodulated/descrambled data ($\tilde{b}_0, \tilde{b}_1, \tilde{b}_2, \ldots, \tilde{b}_{47}$), which is input to a demapper 318. The demapper 318 performs Reed Muller 32-bit decoding (RDEC32) for NACK<=11 and dual Reed Muller 24-bit decoding (RDEC24) for 11≤NACK<=22. In an embodiment, the demapper 318 comprises a dual RM deinterleaver, dual RDEC24 and bit demapper to generate the detected ACK bits ($\hat{O}_i^{ACK}$) and a reliability indicator.

Figure 4:
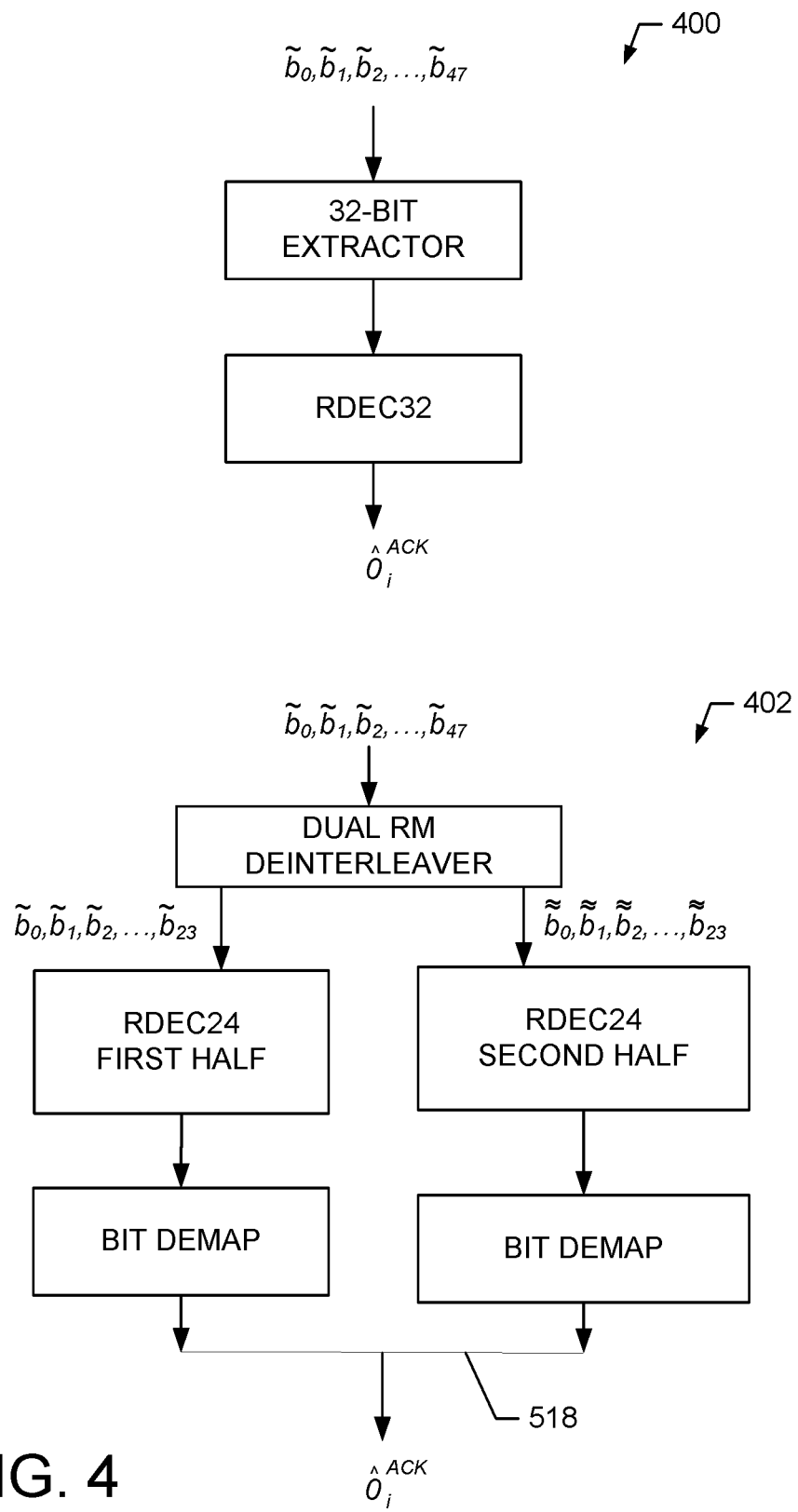
FIG. 4 shows block diagrams of the Reed Muller decoding and bit demapping for two scenarios handled by the receiver shown in FIG. 3.

FIG. 4 shows block diagrams of the Reed Muller decoding and bit demapping for two scenarios handled by the receiver 300 shown in FIG. 3. The decode bit mapper 318 operates so that the ACK bits will be extracted and decoded depending on the number of ACK bits. As shown at the block diagram 400, for $N_{A/N}^{PUCCH\ format\ 3} \leq 11$, the 32 soft bits are extracted from $\tilde{b}_0, \tilde{b}_1, \tilde{b}_2, \ldots, \tilde{b}_{47}$ and passed to the RDEC32. The RDEC32 will produce the decoded ACK bits [$\hat{o}_i^{ACK}$].

As shown at the block diagram 402, for the case of $11 < N_{A/N}^{PUCCH\ format\ 3} \leq 22$, the soft-bits will be deinterleaved to generate the input to dual RDEC24 decoders. Each half then will produce the corresponding decoded bits. The decoded bits will then be demapped by bit demappers to create the final output bits [$\hat{o}_i^{ACK}$].

Figure 5:
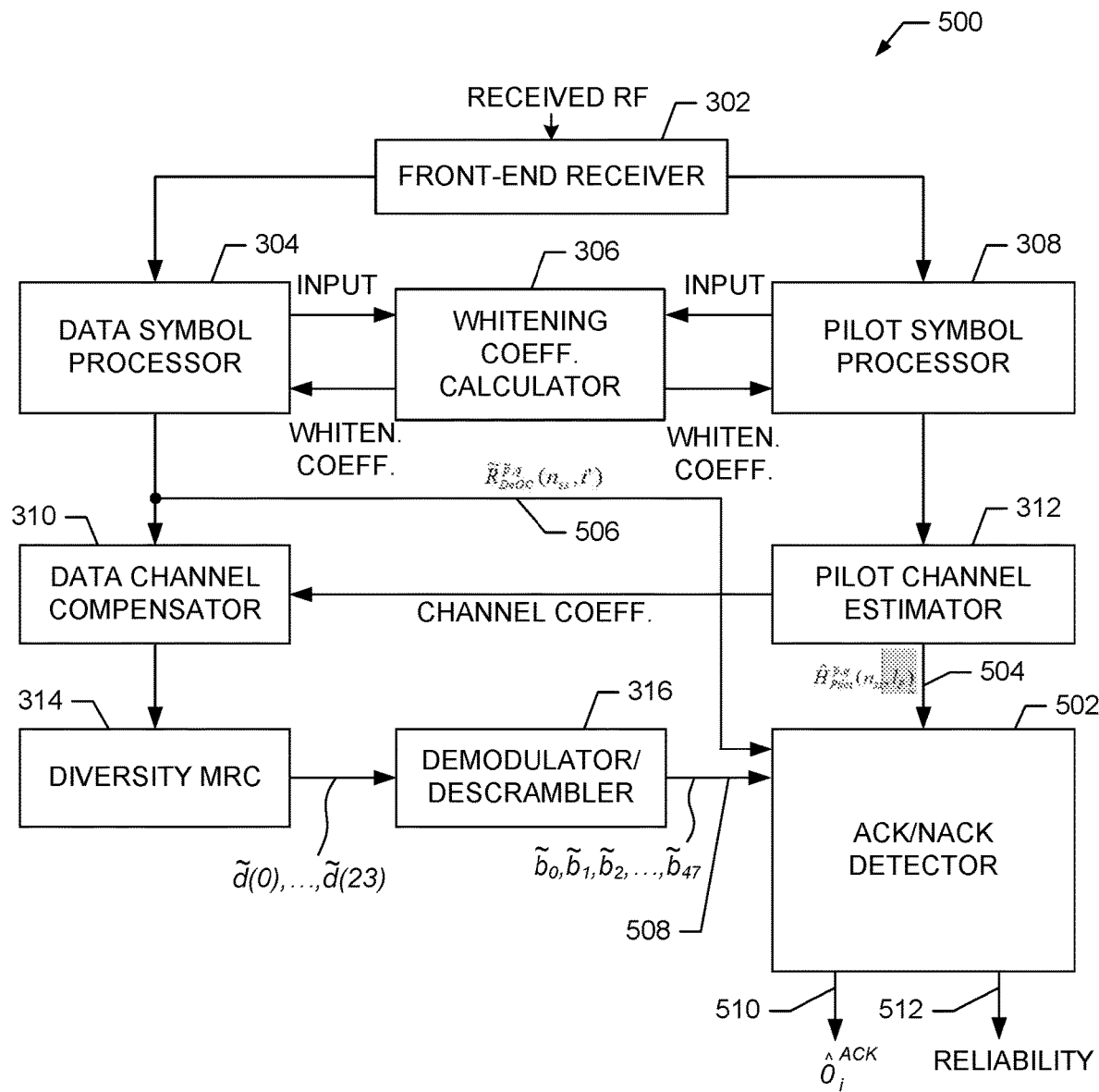
FIG. 5 shows an embodiment of a receiver that comprises an exemplary embodiment of an ACK/NACK detector.

FIG. 5 shows an embodiment of a receiver 500 that comprises an exemplary embodiment of an ACK/NACK detector 502. For example, the AND 502 is suitable for use as the AND 152 shown in FIG. 1. In an exemplary embodiment, the receiver 500 is configured similarly to the receiver 300 shown in FIG. 3, except that the decode bit demapper 318 is replaced with the AND 502. The AND 502 receives the descrambled bits 508 output from the demodulator/descrambler 316. The AND 502 also receives pilot channel coefficients 504 output from the pilot channel estimator 312. For example, in an exemplary embodiment, the pilot channel coefficients 504 are generated from the following expression.

$$\hat{H}_{Pilot}^{p,q}(n_{NN}, I_P) = \begin{cases} \tilde{R}_{whiten\_P}^{p,q}(n_{ss}, I_P)/12 \\ \tilde{R}_{AFC}^{p,q}(n_{ss}, I_P)/12 \end{cases}$$

Additionally, the AND 502 receives data symbol information 506 output from the data symbol processor 304. During operation, the AND 502 processes the received signals to generate ACK bits 510 and reliability indicator 512.

In an exemplary embodiment, the AND 502 comprises a multi-stage list-RM decoder or dual list-RM decoders that are followed by a symbol level maximum likelihood search of the survival candidates from an initial detection of list-based RM32 or dual RM24 Reed Muller decoders. A more detailed description of the AND 502 is provided below.

Figure 6:
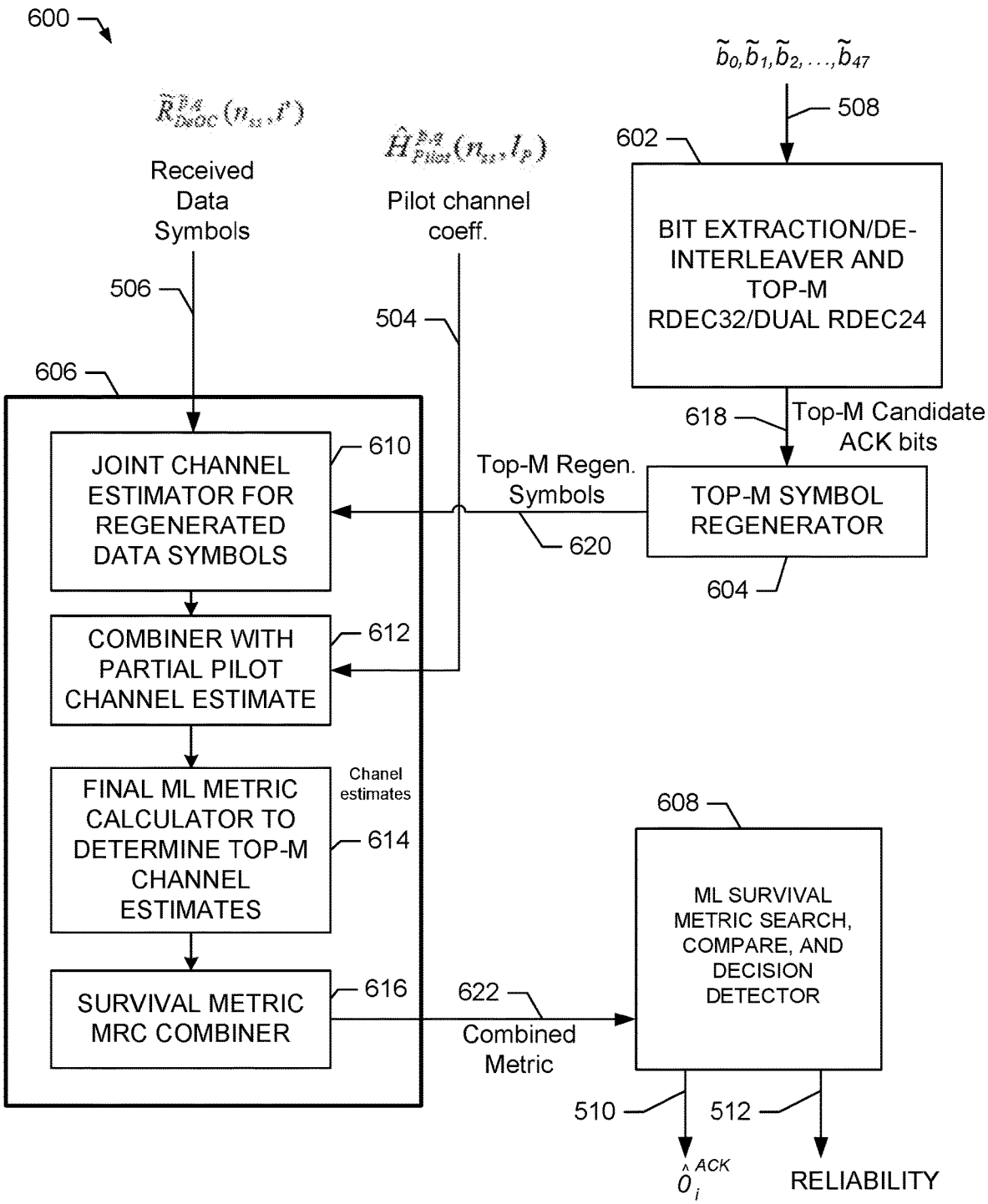
FIG. 6 shows an exemplary embodiment of an ACK/NACK detector.

FIG. 6 shows an exemplary embodiment of an ACK/NACK detector 600. For example, the AND 600 is suitable for use as the AND 502 shown in FIG. 5. In an embodiment, the AND 600 comprises bit extraction/deinterleaver (BED) 602, Top-M symbol regenerator 604, Top-M maximum likelihood (ML) joint channel estimator and metric calculator (CEMC) 606 and decision detector 608. In an embodiment, M is a selectable integer value. In an embodiment, the CEMC 606 comprises the joint channel estimator 610, combiner 612, ML metric calculator 614 and maximal-ratio-combining (MRC) combiner 616.

In an embodiment, the BED 602 receives the descrambled bits 508 from the demodulator/descrambler 316 and performs bit extraction/deinterleaving and Reed Muller decoding to generate Top-M candidate ACK bits 618

$$[\hat{o}^{ACK}_{i \in \left[0, N^{PUCCHformat3}_{A/N} - 1\right]}, M]$$

that are input to the Top-M symbol regenerator 604.

In an embodiment, the Top-M symbol regenerator 604 receives the Top-M candidate ACK bits and generates Top-M regenerated symbols 620 $\tilde{a}$ (0), . . . , $\tilde{a}$ (23) that are input to the joint channel estimator 610 that is part of the CEMC 606.

In an embodiment, the joint channel estimator 610 receives the Top-M regenerated symbols 620 and the data symbols information 506, and generates a joint channel estimate for the regenerated data symbols that is input to the combiner 612. For example, in an exemplary embodiment, the joint channel estimate is generated from the following expression.

$$\tilde{H}^{[0,M-1]}_{Data}(n_{SS}, i') = \tilde{R}^{p,q}_{Data}(n_{SS}, i') \tilde{a} (n_{SS}* N_{SC}^{RB} + i')^{[0,M-1]}_{regen}$$

i'∈[0,11], $n_{SS}$∈[0,1]

In an embodiment, the combiner 612 receives pilot estimate information 504 from the pilot channel estimator 312 and the joint channel estimate from the channel estimator 610 and generates a combined estimate that is input to the metric calculator 614.

In an embodiment, the ML metric calculator 614 receives the combined channel estimates and generates a ML metric that is input to the metric MRC combiner 616. For example, in an exemplary embodiment, the ML metric is generated from the following expression that includes the combined channel estimate.

$$MetricEng^{p,q}_{[0:M-1]} = \sum_{n_{SS}} \left\{ \sum_{i'} |\tilde{H}^{p,q}_{Data[0:M-1]}(n_{SS}, i')|^2 + \sum_{I_P} |\tilde{H}^{p,q}_{Pilot}(n_{SS}, I_P)|^2 \right\}$$

i'∈[0, 11], $n_{SS}$∈[0, 1]

In an embodiment, the MRC combiner 616 receives the ML metric for the Top-M candidates and generates MRC combined metric 622 that is input to the decision detector 608. For example, in an exemplary embodiment, the MRC combined estimate is generated from the following expression.

$$MetricEng^{MRC}_{[0:M-1]} = \sum_{p} \sum_{q} MetricEng^{p,q}_{[0:M-1]}$$

In an embodiment, the decision detector 608 receives the MRC combined metric 622 and performs a search, compare and decision process to detect the final ACK bits $[\hat{o}^{ACK}_i]$ 510 and the reliability indicator 512. For example, the decision detector 608 determines $\hat{j}_{MAX}$ from the following expression.

$$\hat{j}_{MAX} = \text{argmax}[MetricEng^{MRC}_j]$$

The decision detector 608 then determines the final ACK bits from the following expression.

$$\hat{O}^{ACK,Final}_{i \in \left[0, N^{PUCCHformat3}_{A/N} - 1\right]} = \hat{O}^{ACK}_{i \in \left[0, N^{PUCCHformat3}_{A/N} - 1\right]} \cdot \hat{j}_{MAX}$$

Figure 7:
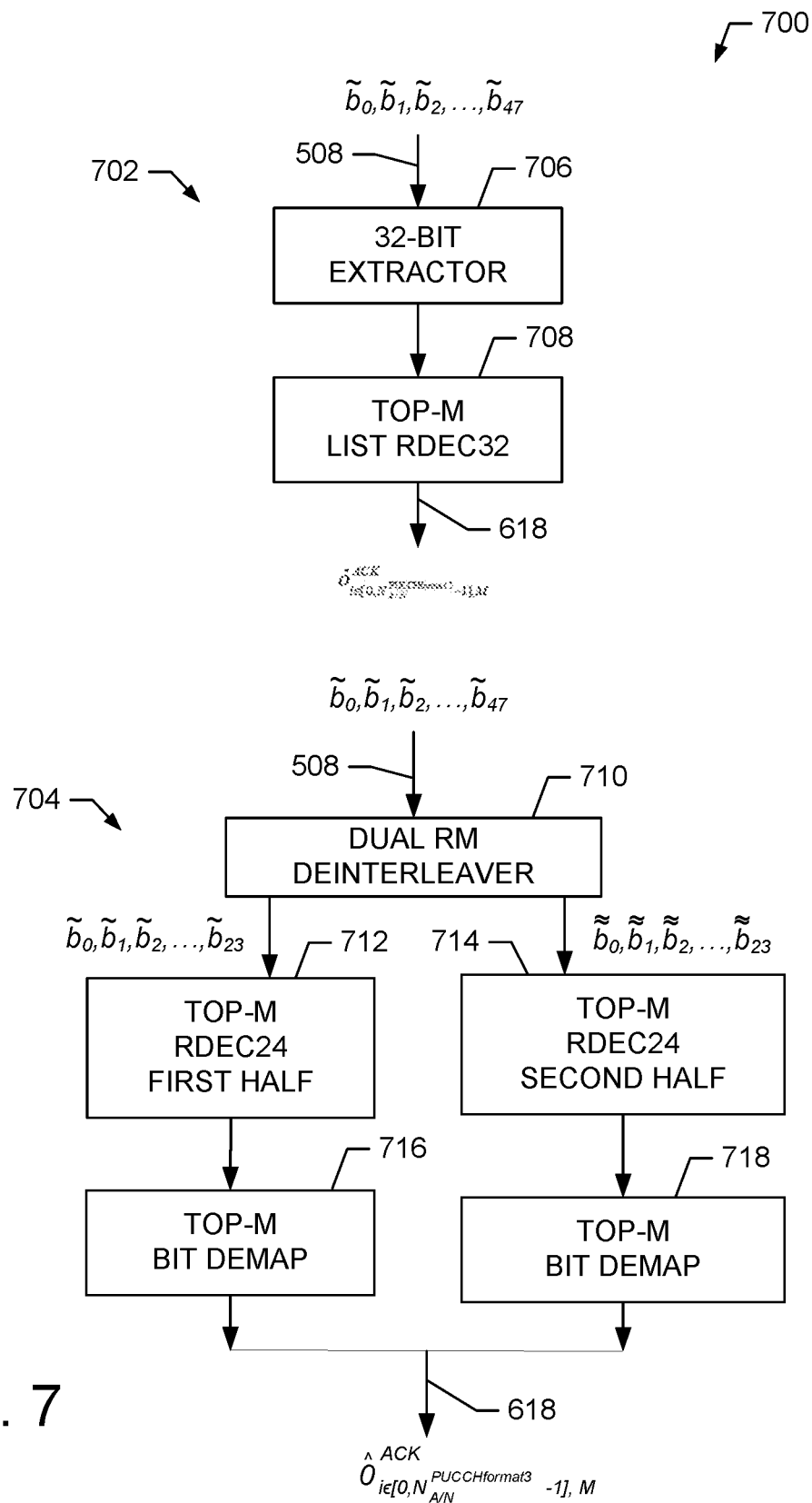
FIG. 7 shows an exemplary embodiment of the bit-extraction and deinterleaver shown in FIG. 6 that utilizes a Top-M list-RDEC32 and a Top-M dual list-RDEC24.

FIG. 7 shows an exemplary embodiment of the bit-extraction and deinterleaver 602 shown in FIG. 6 that utilizes a Top-M list-RDEC32 702 and Top-M dual list-RDEC24 704.

When NACK<=11, the Top-M list RDEC32 702 utilizes a 32-bit extractor 706 that receives the descrambled bits 508 and extracts 32-bits that are input to a Top-M list RDEC32 decoder 708. The RDEC32 decoder 708 generates the Top-M survival candidates 618

$$[\hat{o}^{ACK}_{i \in \left[0, N^{PUCCHformat3}_{A/N} - 1\right]}, M].$$

When 11<NACK<=22, the Top-M dual list-RDEC24 704 utilizes a dual RM deinterleaver 710 to receive the descrambled bits 508 and generate two sets of deinterleaved bits. A first set of deinterleaved bits is input to a first Top-M RDEC24 decoder 712, and a second set of deinterleaved bits is input to a second Top-M RDEC24 decoder 714. The Top-M decoded bits are input to corresponding Top-M bit demappers 716 and 718 that reorder the bits. The output from the demappers 716, 718 form the Top-M survival candidates 618

$$[\hat{o}^{ACK}_{i \in \left[0, N^{PUCCHformat3}_{A/N} - 1\right]}, M].$$

Figure 8:
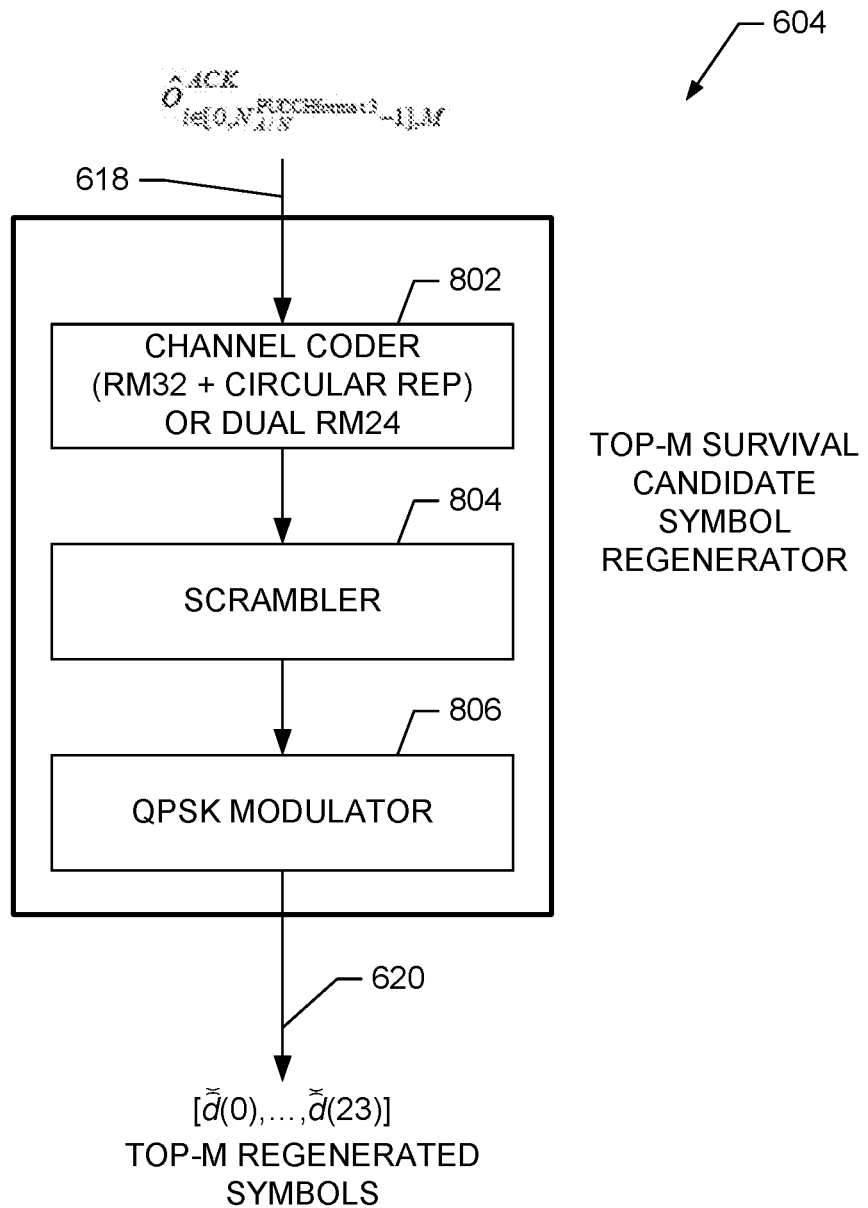
FIG. 8 shows a detailed exemplary embodiment of the Top-M survival candidate symbol regenerator shown in FIG. 6.

FIG. 8 shows a detailed exemplary embodiment of the Top-M survival candidate symbol regenerator 604 shown in FIG. 6. In an embodiment, the regenerator 604 comprises channel coder 802, scrambler 804 and QPSK modulator 806.

In an embodiment, the channel coder 802 receives the Top-M survival candidates 618 and performs channel coding using a RM32 or dual RM24 coders. For example, the channel coder 802 generate coded Top-M survival candidates that are input to the scrambler 804.

In an embodiment, the scrambler 804 scrambles the coded Top-M survival candidates and performs a scrambling process to generate scrambled Top-M candidates that are input to the QPSK modulator 806.

In an embodiment, the QPSK modulator 806 modulates the scrambled Top-M candidates to generate Top-M regenerated symbols 620. As illustrated in FIG. 6, these regenerated symbols are input to the joint channel estimator 610.

Figure 9:
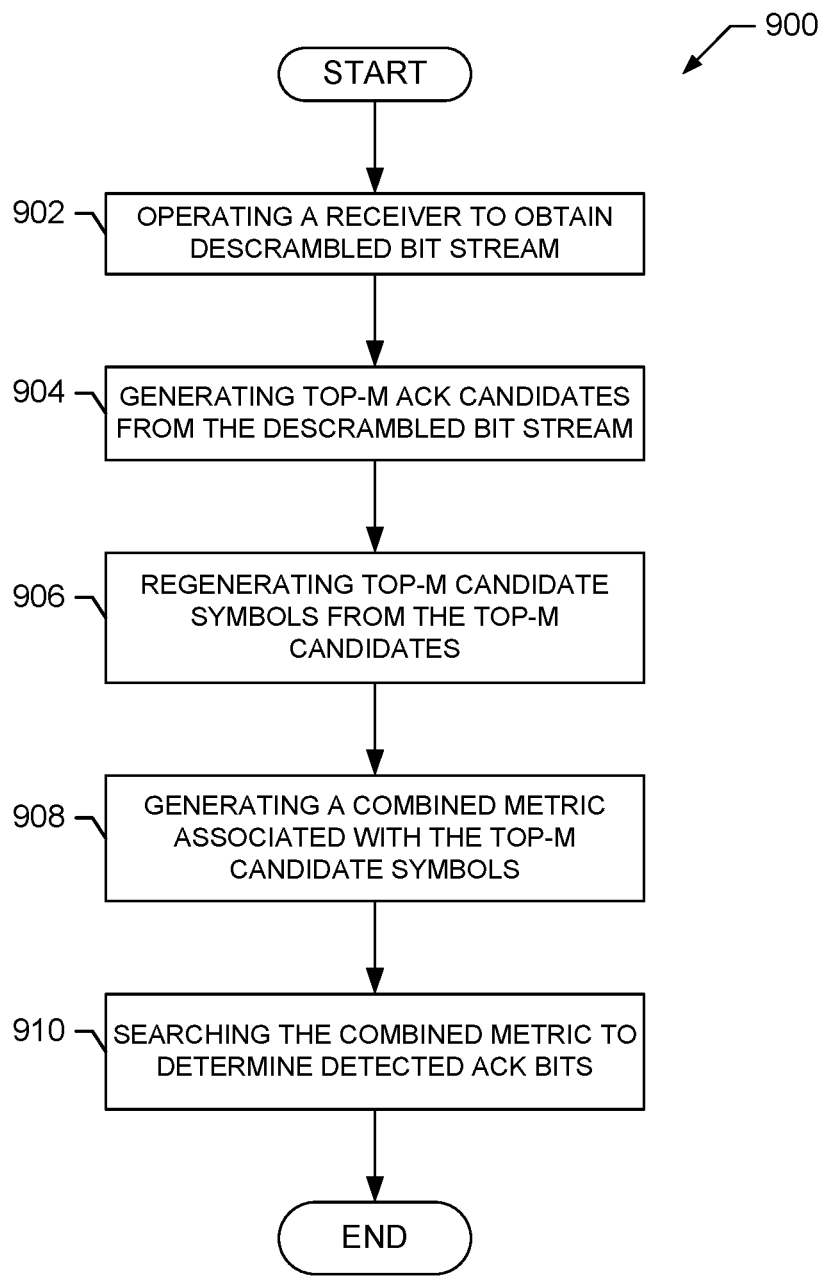
FIG. 9 shows an exemplary embodiment of a method for detecting ACK/NACK bits using embodiments of an ACK/NACK detector as described herein.

FIG. 9 shows an exemplary embodiment of a method 900 for detecting ACK/NACK bits using embodiments of an ACK/NACK detector as described herein. For example, the method 900 is suitable for use with the AND 152 shown in FIG. 1 and the AND 502 shown in FIGS. 5-8.

At block 902, a receiver is operated to generate a descrambled bit stream from a received LTE PUCCH format 3 uplink transmission. The received uplink transmission includes ACK/NACK values. For example, in an embodiment, the receiver 500 receives and processes the uplink transmissions. The demodulator/descrambler 316 generates the descrambled bit stream 508.

At block 904, Top-M ACK candidates are generated from the descrambled bit stream. For example, the bit extractor/deinterleaver 602 receives the descrambled bit stream 508 and generates the Top-M ACK candidates 618.

At block 906, Top-M candidate symbols are generated from the Top-M ACK candidates. For example, the Top-M symbol generator 604 generates the Top-M candidate symbols from the Top-M ACK candidates.

At block 908, a combined metric associated with the Top-M candidate symbols is generated. For example, the CEMC 606 receives the Top-M candidate symbols 620 and generates the combined metric 622.

At block 910, the combined metric is searched to determine detected ACK bits. For example, the ML survival metric searcher 608 searches the combined metric 622 and generates the detected ACK bits 510.

Thus, the method 900 operates to detect ACK bits in a received LTE PUCCH format 3 uplink transmission. It should be noted that the operations of the method 900 may be added to, subtracted from, deleted, changed, rearranged or otherwise modified within the scope of the embodiments.

Figure 10:
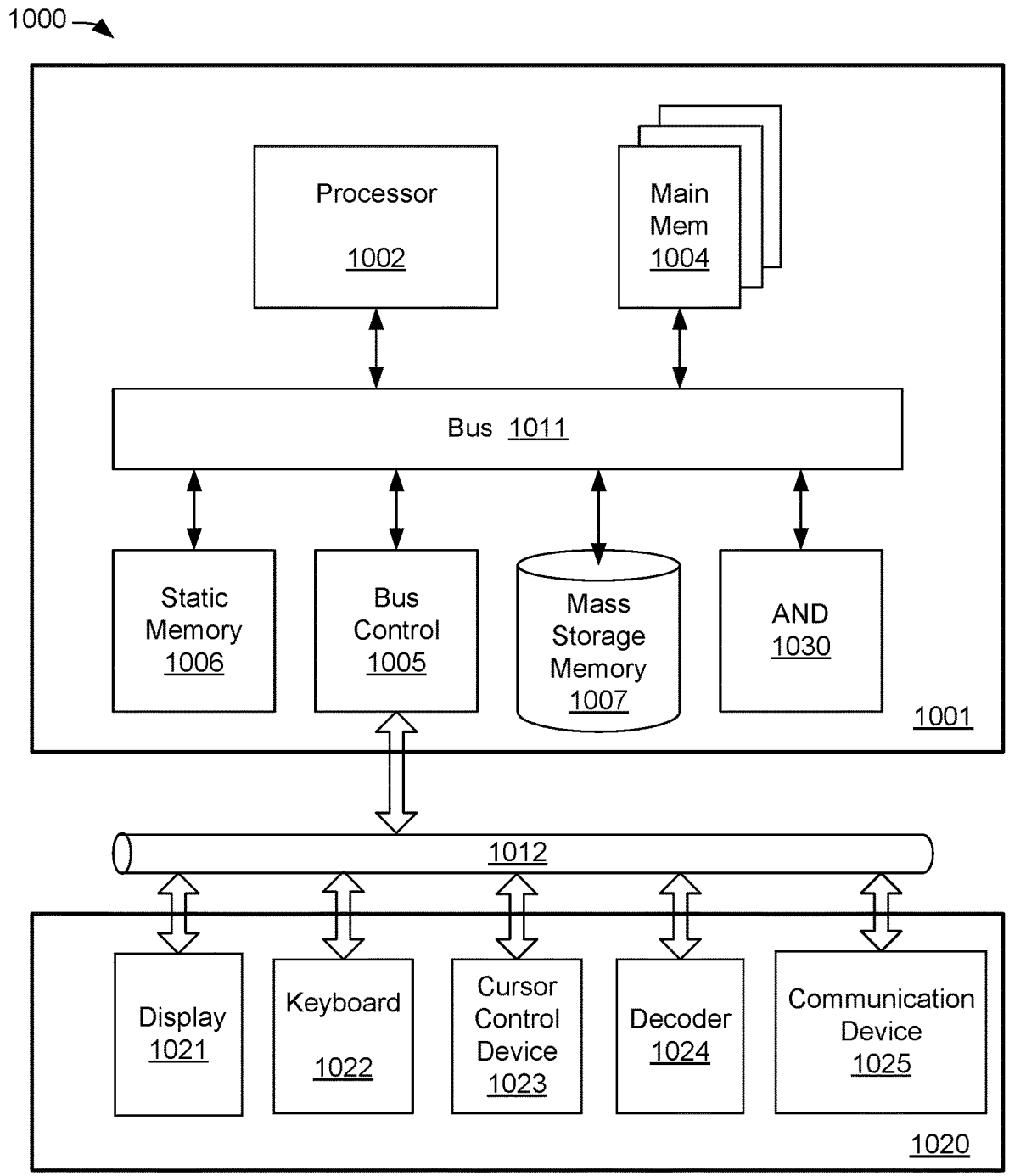
FIG. 10 illustrates an exemplary digital computing system with various features for network communication that include an ACK/NACK detector and associated methods as described herein.

FIG. 10 illustrates an exemplary digital computing system 1000 with various features for network communication that include an ACK/NACK detector 1030 and associated methods as described herein. It will be apparent to those of ordinary skill in the art that other alternative computer system architectures may also be employed.

Computer system 1000 includes a processing unit 1001, an interface bus 1012, and an input/output ("IO") unit 1020. Processing unit 1001 includes a processor 1002, main memory 1004, system bus 1010, static memory device 1006, bus control unit 1005, and mass storage memory 1007. Bus 1010 is used to transmit information between various components and processor 1002 for data processing. Processor 1002 may be any of a wide variety of general-purpose processors, embedded processors, or microprocessors such as ARM® embedded processors, Intel® Core™2 Duo, Core™2 Quad, Xeon®, Pentium™ microprocessor, AMD® family processors, MIPS® embedded processors, or Power PC™ microprocessor.

Main memory 1004, which may include multiple levels of cache memories, stores frequently used data and instructions. Main memory 1004 may be RAM (random access memory), MRAM (magnetic RAM), or flash memory. Static memory 1006 may be a ROM (read-only memory), which is coupled to bus 1011, for storing static information and/or instructions. Bus control unit 1005 is coupled to buses 1010-1012 and controls which component, such as main memory 1004 or processor 1002, can use the bus. Mass storage memory 1007 may be a magnetic disk, solid-state drive ("SSD"), optical disk, hard disk drive, floppy disk, CD-ROM, and/or flash memories for storing large amounts of data.

I/O unit 1020, in one example, includes a display 1021, keyboard 1022, cursor control device 1023, decoder 1024, and communication device 1025. Display device 1021 may be a liquid crystal device, flat panel monitor, cathode ray tube ("CRT"), touch-screen display, or other suitable display device. Display 1021 projects or displays graphical images or windows. Keyboard 1022 can be a conventional alphanumeric input device for communicating information between computer system 1000 and computer operator(s). Another type of user input device is cursor control device 1023, such as a mouse, touch mouse, trackball, or other type of cursor for communicating information between system 1000 and user(s).

Communication device 1025 is coupled to bus 1012 for accessing information from remote computers or servers through wide-area network. Communication device 1025 may include a modem, a router, or a network interface device, or other similar devices that facilitate communication between computer 1000 and the network. In one aspect, communication device 1025 is configured to perform wireless functions.

In one embodiment, AND 1030 is coupled to bus 1010 and is configured to detect ACK/NACK bits in received uplink transmissions. In various exemplary embodiments, the AND 1030 comprises hardware, firmware, or a combination of hardware, and firmware. In an exemplary embodiment, the AND 1030 and communication device 1025 perform data reception and ACK/NACK bit detection in accordance with one or more embodiments of the present invention.

While particular embodiments of the present invention have been shown and described, it will be obvious to those skilled in the art that, based upon the teachings herein, changes and modifications may be made without departing from this exemplary embodiment(s) of the present invention and its broader aspects. Therefore, the appended claims are intended to encompass within their scope all such changes and modifications as are within the true spirit and scope of this exemplary embodiment(s) of the present invention.

What is claimed is:

1. A method for detected ACK/NACK bits received in a long-term evolution (LTE) physical uplink control channel (PUCCH) Format 3 uplink transmission, the method comprising:
    generating a descrambled bit stream having 48 soft bits from information received in an LTE PUCCH Format 3 uplink transmission;
    generating Top-M ACK candidates from the descrambled bit stream, and wherein M is an integer;
    regenerating Top-M candidate symbols from the Top-M ACK candidates;
    calculating channel estimates for the Top-M candidate symbols;
    combining the channel estimates to generate a combined metric; and
    searching the combined metric to determine detected ACK bits.

2. The method of claim 1, wherein the operation of generating the Top-M ACK candidates comprises:
    extracting 32-bits from the descrambled bit stream, when it is determined that a total number of ACK bits is <=11; and
    performing a Reed Muller 32-bit decode of the 32-bits to generate the Top-M ACK candidates.

3. The method of claim 1, wherein the operation of generating the Top-M ACK candidates comprises:
    deinterleaving the descrambled bit stream to generate first and second sets of deinterleaved bits, when it is determined that a total number of ACK bits is in a range of 12 to 22;
    performing a Reed Muller 24-bit decode on each of the first and second sets of deinterleaved bits to generate first and second sets of decoded bits; and
    demapping the first and second sets of decoded bits to generate the Top-M ACK candidates.

4. The method of claim 1, wherein the operation of regenerating Top-M candidate symbols comprises:
- performing one of a Reed Muller 32-bit (RM32) coding or dual Reed Muller 24-bit (RM24) coding on the Top-M candidate bits to generate coded Top-M candidate bits;
- scrambling the Top-M candidate bits to generate scrambled Top-M candidate bits; and
- modulating the scrambled Top-M candidate bits to generate the Top-M candidate symbols.

5. The method of claim 1, wherein the operation of calculating the channel estimates comprises:
- generating a joint channel estimate based on received data symbols and the Top-M candidate symbols;
- combining the joint channel estimate with a pilot channel estimate to generate a combined Top-M channel estimate;
- calculating an ML metric from the combined Top-M channel estimate; and
- combining the ML metric to generate to generate the combined metric.

6. An apparatus for detected ACK/NACK bits received in a long-term evolution (LTE) physical uplink control channel (PUCCH) Format 3 uplink transmission, the apparatus comprising:
- a processor and a memory configured as:
- a descrambler that generates 48 descrambled soft bits from information in a received LTE PUCCH Format 3 uplink transmission;
- a Top-M Reed Muller (RM) decoder that generates Top-M ACK candidates from the descrambled bit stream, and wherein M is an integer;
- a symbol regenerator that regenerates Top-M candidate symbols from the Top-M ACK candidates;
- a channel estimator that calculates channel estimates for the Top-M candidate symbols;
- a combiner that combines the channel estimates generate a combined metric; and
- a decision detector that searches the combined metric to determine detected ACK bits.

7. The apparatus of claim 6, wherein the Top-M RM decoder comprises:
- a bit extractor that extracts 32-bits from the descrambled bit stream, when it is determined that a total number of ACK bits is <=11; and
- a RM 32-bit decoder that decodes the 32-bits to generate the Top-M ACK candidates.

8. The apparatus of claim 6, wherein the Top-M RM decoder comprises:
- a dual deinterleaver that deinterleaves the descrambled bit stream to generate first and second sets of deinterleaved bits, when it is determined that a total number of ACK bits is in a range of 12 to 22;
- dual RM 24-bit decoders that perform Reed Muller 24-bit decoding on each of the first and second sets of deinterleaved bits to generate first and second sets of decoded bits; and
- dual demappers that demap the first and second sets of decoded bits to generate the Top-M ACK candidates.

9. The apparatus of claim 6, wherein the symbol regenerator comprises:
- a RM coder that performs one of a RM 32-bit coding or dual RM 24-bit coding on the Top-M candidate bits to generated coded Top-M candidate bits;
- a scrambler that scrambles the Top-M candidate bits to generate scrambled Top-M candidate bits; and
- modulator that modulates the scrambled Top-M candidate bits to generate the Top-M candidate symbols.

10. The method of claim 6, wherein the channel estimator comprises:
- a joint channel estimator for generating a joint channel estimate based on received data symbols and the Top-M candidate symbols;
- a combiner that combines the joint channel estimate with a pilot channel estimate to generate a combined Top-M channel estimate;
- a calculator that calculates an ML metric from the combined Top-M channel estimate; and
- an maximal-ratio-combiner (MRC) that combines the ML metric to generate to generate the combined metric.

11. An apparatus for detected ACK/NACK bits received in a long-term evolution (LTE) physical uplink control channel (PUCCH) Format 3 uplink transmission, the apparatus comprising:
- a processor and a memory configured as:
- means for generating a descrambled bit stream having 48 descrambled soft bits from information received in an LTE PUCCH Format 3 uplink transmission;
- means for generating ACK candidates from the descrambled bits stream;
- means for regenerating candidate symbols from the ACK candidates;
- means for calculating channel estimates for the candidate symbols;
- means for combining to the channel estimates generate a combined metric; and
- means for searching the combined metric to determine detected ACK bits.

12. The apparatus of claim 11, wherein the means for generating the ACK candidates comprises:
- means for extracting 32-bits from the descrambled bit stream, when it is determined that a total number of ACK bits is <=11; and
- means for performing a Reed Muller 32-bit decode of the 32-bits to generate the ACK candidates.

13. The apparatus of claim 11, wherein the means for generating the ACK candidates comprises:
- means for deinterleaving the descrambled bit stream to generate first and second sets of deinterleaved bits, when it is determined that a total number of ACK bits is in a range of 12 to 22;
- means for performing a Reed Muller 24-bit decode on each of the first and second sets of deinterleaved bits to generate first and second sets of decoded bits; and
- means for demapping the first and second sets of decoded bits to generate the ACK candidates.

14. The apparatus of claim 11, wherein the means for regenerating the candidate symbols comprises:
- means for performing one of a Reed Muller 32-bit (RM32) coding or dual Reed Muller 24-bit (RM24) coding on the candidate bits to generate coded candidate bits;
- means for scrambling the candidate bits to generate scrambled candidate bits; and
- means for modulating the scrambled candidate bits to generate the candidate symbols.

15. The apparatus of claim 11, wherein the means for calculating the channel estimates comprises:
- means for generating a joint channel estimate based on received data symbols and the candidate symbols;
- means for combining the joint channel estimate with a pilot channel estimate to generate a combined channel estimate;
- means for calculating an ML metric from the combined channel estimate; and
- means for combining the ML metric to generate to generate the combined metric.

* * * * *